United States Patent
Fujita et al.

(10) Patent No.: US 10,014,662 B2
(45) Date of Patent: *Jul. 3, 2018

(54) QUANTUM CASCADE LASER

(71) Applicant: HAMAMATSU PHOTONICS K.K., Hamamatsu-shi, Shizuoka (JP)

(72) Inventors: Kazuue Fujita, Hamamatsu (JP); Akio Ito, Hamamatsu (JP); Tadataka Edamura, Hamamatsu (JP); Tatsuo Dougakiuchi, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/193,249

(22) Filed: Jun. 27, 2016

(65) Prior Publication Data
US 2017/0033536 A1 Feb. 2, 2017

(30) Foreign Application Priority Data
Jul. 29, 2015 (JP) ................. 2015-149272

(51) Int. Cl.
*H01S 5/10* (2006.01)
*H01S 5/20* (2006.01)
(Continued)

(52) U.S. Cl.
CPC .......... *H01S 5/2018* (2013.01); *H01S 5/0604* (2013.01); *H01S 5/1096* (2013.01);
(Continued)

(58) Field of Classification Search
CPC ........ H01S 5/2018; H01S 5/2027; H01S 5/24; H01S 5/3401; H01S 5/3402; H01S 5/0604; H01S 2302/02
See application file for complete search history.

(56) References Cited

U.S. PATENT DOCUMENTS

2015/0311665 A1* 10/2015 Belkin ................. H01S 5/3402
372/20

FOREIGN PATENT DOCUMENTS

JP H08-279647 A 10/1996
JP 09-146131 * 6/1997
(Continued)

OTHER PUBLICATIONS

Karun Vijayraghavan et al., "Terahertz sources based on Čerenkov difference-frequency generation in quantum cascade lasers," Applied Physics Letters, 2012, pp. 251104-1-251104-4, vol. 100.
(Continued)

*Primary Examiner* — Tod T Van Roy
(74) *Attorney, Agent, or Firm* — Drinker Biddle & Reath LLP

(57) ABSTRACT

A quantum cascade laser is configured with a semiconductor substrate, and an active layer provided on a first surface of the substrate and having a cascade structure in the form of a multistage lamination of unit laminate structures each of which includes an emission layer and an injection layer. The active layer is configured to be capable of generating first pump light of a frequency $\omega_1$ and second pump light of a frequency $\omega_2$ by intersubband emission transitions of electrons, and to generate output light of a difference frequency $\omega$ by difference frequency generation from the first pump light and the second pump light. Grooves respectively formed in a direction intersecting with a resonating direction in a laser cavity structure are provided on a second surface opposite to the first surface of the substrate.

3 Claims, 14 Drawing Sheets

(51) Int. Cl.
*H01S 5/24* (2006.01)
*H01S 5/34* (2006.01)
*H01S 5/343* (2006.01)
*H01S 5/06* (2006.01)
*H01S 5/18* (2006.01)

(52) U.S. Cl.
CPC .............. *H01S 5/24* (2013.01); *H01S 5/3402* (2013.01); *H01S 5/34306* (2013.01); *H01S 5/18* (2013.01); *H01S 2302/02* (2013.01)

(56) References Cited

FOREIGN PATENT DOCUMENTS

| | | |
|---|---|---|
| JP | 2010-521815 A | 6/2010 |
| JP | 2011-035139 A | 2/2011 |
| JP | 2011-243781 A | 12/2011 |
| JP | 2013-098251 A | 5/2013 |
| WO | WO-2014/018599 A1 | 1/2014 |

OTHER PUBLICATIONS

Karun Vijayraghavan et al., "Broadly tunable terahertz generation in mid-infrared quantum cascade lasers," Nature Communications, 2013, pp. 1-7, vol. 4, article 2021.

Rüdeger Köhler et al., "Terahertz semiconductor-heterostructure laser," Nature, May 9, 2002, pp. 156-159, vol. 417.

S. Fathololoumi et al., "Terahertz quantum cascade lasers operating up to ~ 200 K with optimized oscillator strength and improved injection tunneling," Optics Express, Feb. 13, 2012, pp. 3866-3876, vol. 20, No. 4.

Q. Y. Lu et al., "Room temperature single-mode terahertz sources based on intracavity difference-frequency generation in quantum cascade lasers," Applied Physics Letters, 2011, pp. 131106-1-131106-3, vol. 99.

Q. Y. Lu et al. "Widely tuned room temperature terahertz quantum cascade laser sources based on difference-frequency generation," Applied Physics Letters, 2012, pp. 251121-1-251121-4, vol. 101.

Q. Y. Lu et al., "Room temperature terahertz quantum cascade laser sources with 215 µW output power through epilayer-down mounting," Applied Physics Letters, 2013, pp. 011101-1-011101-4, vol. 103.

Q. Y. Lu et al., "Continuous operation of a monolithic semiconductor terahertz source at room temperature," Applied Physics Letters, 2014, pp. 221105-1-221105-5, vol. 104.

Christian Pflügl et al., Surface-emitting terahertz quantum cascade laser source based on intracavity difference-frequency generation, Applied Physics Letters, 2008, pp. 161110-1-161110-3, vol. 93.

U.S. Office Action dated Feb. 6, 2017 that issued in U.S. Appl. No. 15/251,119 including Double Patenting Rejections on pp. 2-4.

\* cited by examiner

*Fig.9*

| SEMICONDUCTOR LAYER | | COMPOSITION | LAYER THICKNESS | DOPING |
|---|---|---|---|---|
| INJECTION BARRIER LAYER 171 | | InAlAs | 3.8nm | undoped |
| EMISSION LAYER 17 | WELL LAYER 161 | InGaAs | 3.8nm | undoped |
| | BARRIER LAYER 172 | InAlAs | 2.3nm | undoped |
| | 162 | InGaAs | 8.5nm | undoped |
| | 173 | InAlAs | 1.0nm | undoped |
| | 163 | InGaAs | 6.9nm | undoped |
| | 174 | InAlAs | 1.1nm | undoped |
| | 164 | InGaAs | 5.6nm | undoped |
| EXIT BARRIER LAYER 191 | | InAlAs | 1.2nm | undoped |
| INJECTION LAYER 18 | WELL LAYER 181 | InGaAs | 4.8nm | undoped |
| | BARRIER LAYER 192 | InAlAs | 1.3nm | undoped |
| | 182 | InGaAs | 4.5nm | undoped |
| | 193 | InAlAs | 1.4nm | undoped |
| | 183 | InGaAs | 4.2nm | undoped |
| | 194 | InAlAs | 1.6nm | Si doped: $9 \times 10^{16}/cm^3$ |
| | 184 | InGaAs | 4.1nm | Si doped: $9 \times 10^{16}/cm^3$ |
| | 195 | InAlAs | 1.8nm | Si doped: $9 \times 10^{16}/cm^3$ |
| | 185 | InGaAs | 4.0nm | Si doped: $9 \times 10^{16}/cm^3$ |
| | 196 | InAlAs | 2.3nm | undoped |
| | 186 | InGaAs | 4.0nm | undoped |
| | 197 | InAlAs | 2.6nm | undoped |
| | 187 | InGaAs | 4.0nm | undoped |

QUANTUM CASCADE LASER

BACKGROUND OF THE INVENTION

Field of the Invention

The present invention relates to a quantum cascade laser using intersubband transitions in a quantum well structure.

Related Background Art

Light in a mid-infrared wavelength range (for example, wavelengths of 5 to 30 μm) is an important wavelength range in the field of spectrometric analysis. As a high-performance semiconductor light source in this wavelength range, attention has been attracted to quantum cascade lasers (QCL) in recent years (e.g., cf. Patent Documents 1 to 3).

The quantum cascade laser is a monopolar type laser element which uses a level structure including subbands formed in a semiconductor quantum well structure, to generate light by transitions of electrons between the subbands, wherein quantum well emission layers, each of which is formed in the quantum well structure and serves as an active region, are cascade-coupled in multiple stages, thereby enabling realization of high-efficiency and high-output operation. This cascade coupling of the quantum well emission layers is realized by use of electron injection layers for injecting electrons into emission upper levels, so as to alternately stack the quantum well emission layers and the injection layers.

Patent Document 1: International Publication No. WO 2014/018599

Patent Document 2: Japanese Patent Application Laid-Open Publication No. H8-279647

Patent Document 3: Japanese Translation of PCT International Application Publication No. 2010-521815

Patent Document 4: Japanese Patent Application Laid-Open Publication No. 2011-035139

Patent Document 5: Japanese Patent Application Laid-Open Publication No. 2011-243781

Patent Document 6: Japanese Patent Application Laid-Open Publication No. 2013-098251

Non Patent Document 1: K. Vijayraghavan et al., "Terahertz sources based on Cerenkov difference-frequency generation in quantum cascade lasers", Appl. Phys. Lett. Vol. 100 (2012) pp. 251104-1-251104-4

Non Patent Document 2: K. Vijayraghavan et al., "Broadly tunable terahertz generation in mid-infrared quantum cascade lasers", Nat. Commun. Vol. 4 Art. 2021 (2013) pp. 1-7

Non Patent Document 3: R. Kohler et al., "Terahertz semiconductor-heterostructure laser", NATURE Vol. 417 (2002) pp. 156-159

Non Patent Document 4: S. Fathololoumi et al., "Terahertz quantum cascade lasers operating up to ~200 K with optimized oscillator strength and improved injection tunneling", Optics Express Vol. 20 (2012) pp. 3866-3876

Non Patent Document 5: Q. Y. Lu et al., "Room temperature single-mode terahertz sources based on intracavity difference-frequency generation in quantum cascade lasers", Appl. Phys. Left. Vol. 99 (2011) 131106-1-131106-3

Non Patent Document 6: Q. Y. Lu et al., "Widely tuned room temperature terahertz quantum cascade laser sources based on difference-frequency generation", Appl. Phys. Lett. Vol. 101 (2012) pp. 251121-1-251121-4

Non Patent Document 7: Q. Y. Lu et al., "Room temperature terahertz quantum cascade laser sources with 215 μW output power through epilayer-down mounting", Appl. Phys. Lett. Vol. 103 (2013) pp. 011101-1-011101-4

Non Patent Document 8: Q. Y. Lu et al., "Continuous operation of a monolithic semiconductor terahertz source at room temperature", Appl. Phys. Lett. Vol. 104 (2014) pp. 221105-1-221105-5

Non Patent Document 9: C. Pflugl et al., "Surface-emitting terahertz quantum cascade laser source based on intracavity difference-frequency generation", Appl. Phys. Lett. Vol. 93 (2008) pp. 161110-1-161110-3

SUMMARY OF THE INVENTION

The quantum cascade laser was first successfully lased in 1994 and since then, the lasing wavelength thereof has been actively increased toward longer wavelengths; in 2002, R. Kohler et al. reported the lasing in the terahertz (THz) band (Non Patent Document 3: NATURE Vol. 417 (2002) pp. 156-159). The terahertz band is a so-called far-infrared region of around 100 μm in terms of wavelength, for example, wavelength of from about 60 μm to 300 μm, which is a range corresponding to the boundary between radio waves and light. Since the terahertz light (terahertz wave) has the feature of possessing both of transmitting property of radio wave and rectilinearity of light, application thereof as unprecedented sensing means is under research in various fields including the medical biology, security, communication, cosmic observation, and so on.

It was hard for the semiconductor lasers of conventional structures to realize the increase in wavelength up to the terahertz band, but the quantum cascade lasers have realized lasing in the terahertz band as described above. However, it is the present status that the laser operation is still limited to an extremely-low temperature environment using liquid nitrogen, and there are problems in effectiveness to industrial application.

For example, S. Fathololoumi et al. (Non Patent Document 4: Optics Express Vol. 20 (2012) pp. 3866-3876) reported the maximum operating temperature ~200K at the oscillation frequency of 2.85 THz in the configuration wherein the active layer is configured by cascade coupling of triple quantum well structures of $GaAs/Al_xGa_{1-x}As$ (x=0.15). However, the status quo method is in a situation where it is very difficult to achieve higher-temperature operation.

On the other hand, M. A. Belkin et al. have succeeded in generating the terahertz light (THz light) by difference frequency generation (DFG) through the use of two-wavelength oscillation type mid-infrared QCL and the second order nonlinear optical effect in the QCL (Patent Document 3: Japanese Translation of PCT International Application Publication No. 2010-521815). It was already confirmed that the QCL for generating the terahertz light by this configuration (DFG-THz-QCL) was able to operate at a room temperature, and further improvement in characteristics is expected.

Recently, a group in Northwestern University also reported the DFG-THz-QCL (Non Patent Document 5: Appl. Phys. Lett. Vol. 99 (2011) 131106-1-131106-3, Non Patent Document 6: Appl. Phys. Lett. Vol. 101 (2012) pp. 251121-1-251121-4, Non Patent Document 7: Appl. Phys. Lett. Vol. 103 (2013) pp. 011101-1-011101-4). Most recently, room temperature continuous operation at a level of μW has been realized, and the output at a level of mW in the room temperature is also reported; however, it is in a situation where a large electric current of 10 A or more is necessary, and further improvement in characteristics is demanded (Non Patent Document 8: Appl. Phys. Lett. Vol. 104 (2014) pp. 221105-1-221105-5).

As one of problems in improvement in characteristics of the THz-QCL, there is reabsorption inside the substrate of the terahertz light generated in the active layer. Even when an InP substrate not doped with impurities is used as a substrate of the quantum cascade laser, for example, an absorption coefficient for the light of the frequency of 3 THz is about 20 cm$^{-1}$. At this time, the coherence length is about 100 µm; therefore, most of the terahertz light generated in the active layer is absorbed inside the substrate without being extracted to the outside.

Currently, in order to realize high extraction efficiency of the terahertz light, a method is used applying Cerenkov phase matching, and, for example, a configuration is used in which an element end face polished at an angle of about 20° or 30° serves as an output end face of the terahertz light (e.g., cf. Patent Document 1: International Publication No. WO 2014/018599, Non Patent Document 1: Appl. Phys. Lett. Vol. 100 (2012) pp. 251104-1-251104-4, Non Patent Document 2: Nat. Commun. Vol. 4 Art. 2021 (2013) pp. 1-7). As a result, terahertz light at a level of µW has been realized; however, a sufficient output for practical use has not been obtained. In this configuration in which the element end face is polished, the terahertz light that can be extracted to the outside is only the light generated in a range of about several hundred µm near the end face, due to absorption inside the substrate and the like.

In the THz-QCL, an extraction method has been studied of the terahertz light output from an element surface using a metal grating. However, in this configuration, there are problems such as loss of the light due to the metal, and that mode coupling efficiency is not optimized for the terahertz light; currently, a better terahertz output characteristics than the QCL using Cerenkov phase matching has not been obtained (Non Patent Document 9: Appl. Phys. Lett. Vol. 93 (2008) pp. 161110-1-161110-3).

The present invention has been made in order to solve the above problem, and an object thereof is to provide a quantum cascade laser capable of suitably outputting light such as the terahertz light generated by the difference frequency generation.

In order to achieve the above object, a quantum cascade laser according to the present invention includes (1) a semiconductor substrate; and (2) an active layer provided on a first surface of the semiconductor substrate and having a cascade structure in which quantum well emission layers and injection layers are alternately stacked in the form of a multistage lamination of unit laminate structures each of which includes the quantum well emission layer and the injection layer, wherein (3) the active layer is configured to be capable of generating first pump light of a first frequency $\omega_1$ and second pump light of a second frequency $\omega_2$ by intersubband emission transitions of electrons, and to generate output light of a difference frequency $\omega$ between the first frequency $\omega_1$ and the second frequency $\omega_2$ by difference frequency generation from the first pump light and the second pump light, and (4) a plurality of grooves respectively formed in a direction intersecting with a resonating direction in a laser cavity structure are provided on a second surface opposite to the first surface of the semiconductor substrate.

In the above-described quantum cascade laser, the active layer is configured to be capable of generating light components of two frequencies of the first pump light of the first frequency (angular frequency, hereinafter simply referred to as frequency) $\omega_1$ and the second pump light of the second frequency $\omega_2$. In this configuration, for example, long-wavelength output light such as the terahertz light can be generated as light of a difference frequency $\omega=|\omega_1-\omega_2|$ by using the difference frequency generation by the first pump light and the second pump light.

In the above configuration, the plurality of grooves are formed extending in a direction intersecting with a resonating direction of light in a laser element, on the second surface being a rear surface of the semiconductor substrate, for the output light generated by the difference frequency generation in the active layer. According to this configuration, the light can be suitably output, such as the terahertz light, generated by the difference frequency generation in the active layer, by making each of side surfaces of the plurality of grooves provided on the substrate rear surface function as an output surface for the output light.

According to the quantum cascade laser of the present invention, the active layer is configured to be capable of generating the first pump light of the first frequency $\omega_1$ and the second pump light of the second frequency $\omega_2$, and to generate the output light of the difference frequency $\omega$ by the difference frequency generation from the first pump light and the second pump light, and the plurality of grooves respectively formed in the direction intersecting with the resonating direction of the light in the laser element are provided on the second surface being the rear surface of the semiconductor substrate, thereby enabling suitable output of the light such as the terahertz light generated by the difference frequency generation.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 9 is a table showing an example of a structure of the unit laminate structure of one period in the active layer.

DESCRIPTION OF THE EMBODIMENTS

Figure 1:
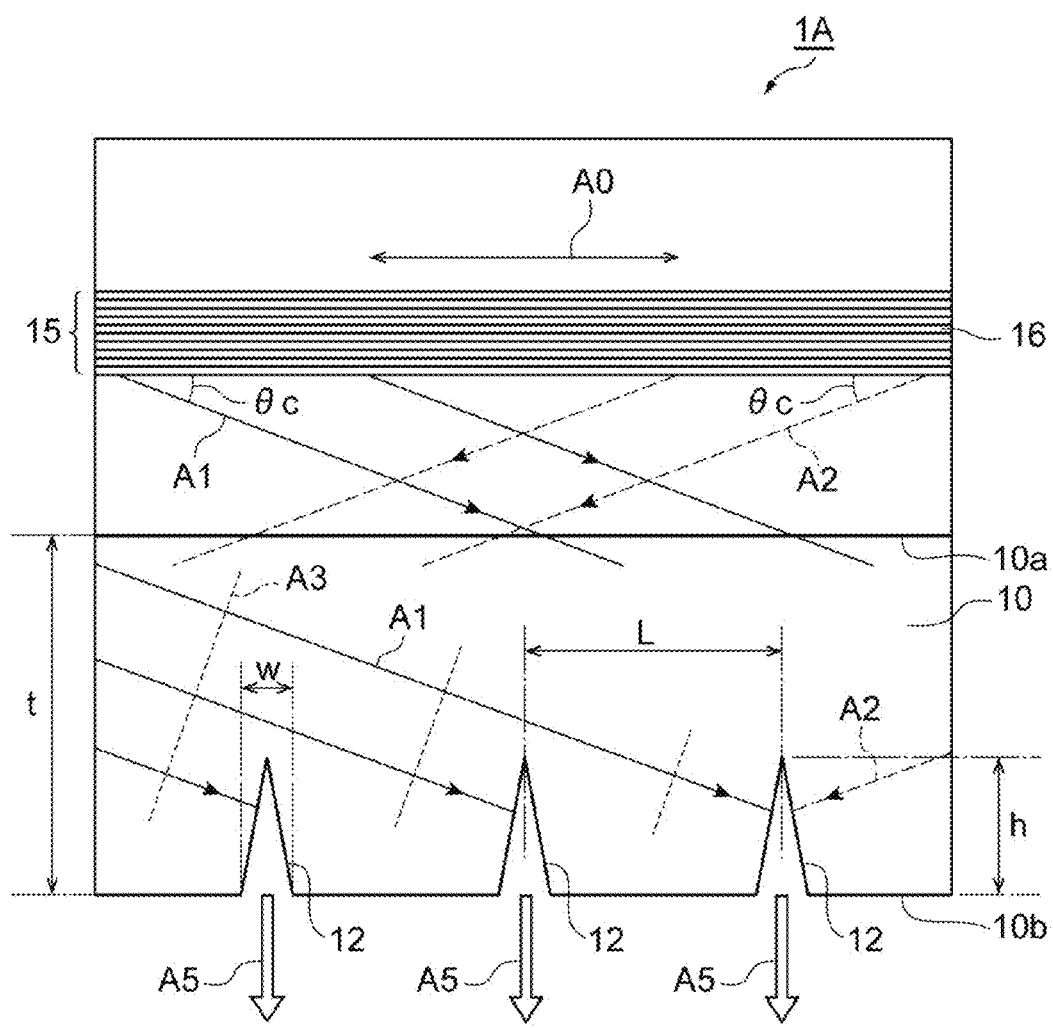
FIG. 1 is a side view schematically showing a configuration of a quantum cascade laser and generation of output light by difference frequency generation.

Hereinafter, an embodiment of a quantum cascade laser according to the present invention will be described in detail with reference to the drawings. In the description of the drawings, the same elements will be denoted by the same reference signs, without redundant description. The dimensional ratios in the drawings are not always coincident with those in the description.

FIG. 1 is a side view schematically showing a configuration of a quantum cascade laser and generation of output light by difference frequency generation. A quantum cascade laser 1A of the present embodiment is a monopolar type laser element that generates light by using transitions of electrons between the subbands in a semiconductor quantum well structure. This quantum cascade laser 1A includes a semiconductor substrate 10, and an active layer 15 formed on a first surface (front surface) 10a of the semiconductor substrate 10.

The active layer 15 has a cascade structure in which quantum well emission layers to be used for generation of light and electron injection layers to be used for injection of electrons into the emission layers are stacked alternately in multiple stages. Specifically, when a unit laminate structure 16 of one period is defined as a semiconductor laminate structure consisting of a quantum well emission layer and an injection layer, the active layer 15 having the cascade structure is configured by stacking the unit laminate structure 16 in multiple stages. The number of unit laminate structures 16 stacked including the quantum well emission layer and the injection layer is set appropriately according to the specific configuration, characteristics, and the like of the laser element. The active layer 15 is formed on the semiconductor substrate 10 directly, or via another semiconductor layer.

In the quantum cascade laser 1A of the present embodiment, the active layer 15 is configured to be capable of generating first pump light of a first frequency $\omega_1$ and second pump light of a second frequency $\omega_2$ by intersubband emission transitions of electrons, and to generate output light of difference frequency $\omega=|\omega_1-\omega_2|$ between the first frequency $\omega_1$ and the second frequency $\omega_2$ by difference frequency generation (DFG) from the first pump light and the second pump light.

In this configuration, each of the first pump light, second pump light of the frequencies $\omega_1$, $\omega_2$ to be generated in the active layer 15 is, for example, mid-infrared light. The light of the frequency $\omega$ to be generated by the difference frequency generation is, for example, long-wavelength light such as the terahertz light. In FIG. 1, a resonating direction (travelling direction of pump light) of the first pump light and the second pump light in a laser cavity structure is shown by an arrow A0. The resonating direction A0 is substantially parallel to the first surface 10a of the semiconductor substrate 10 on which the semiconductor laminate structure including the active layer 15 is formed.

Figure 2:
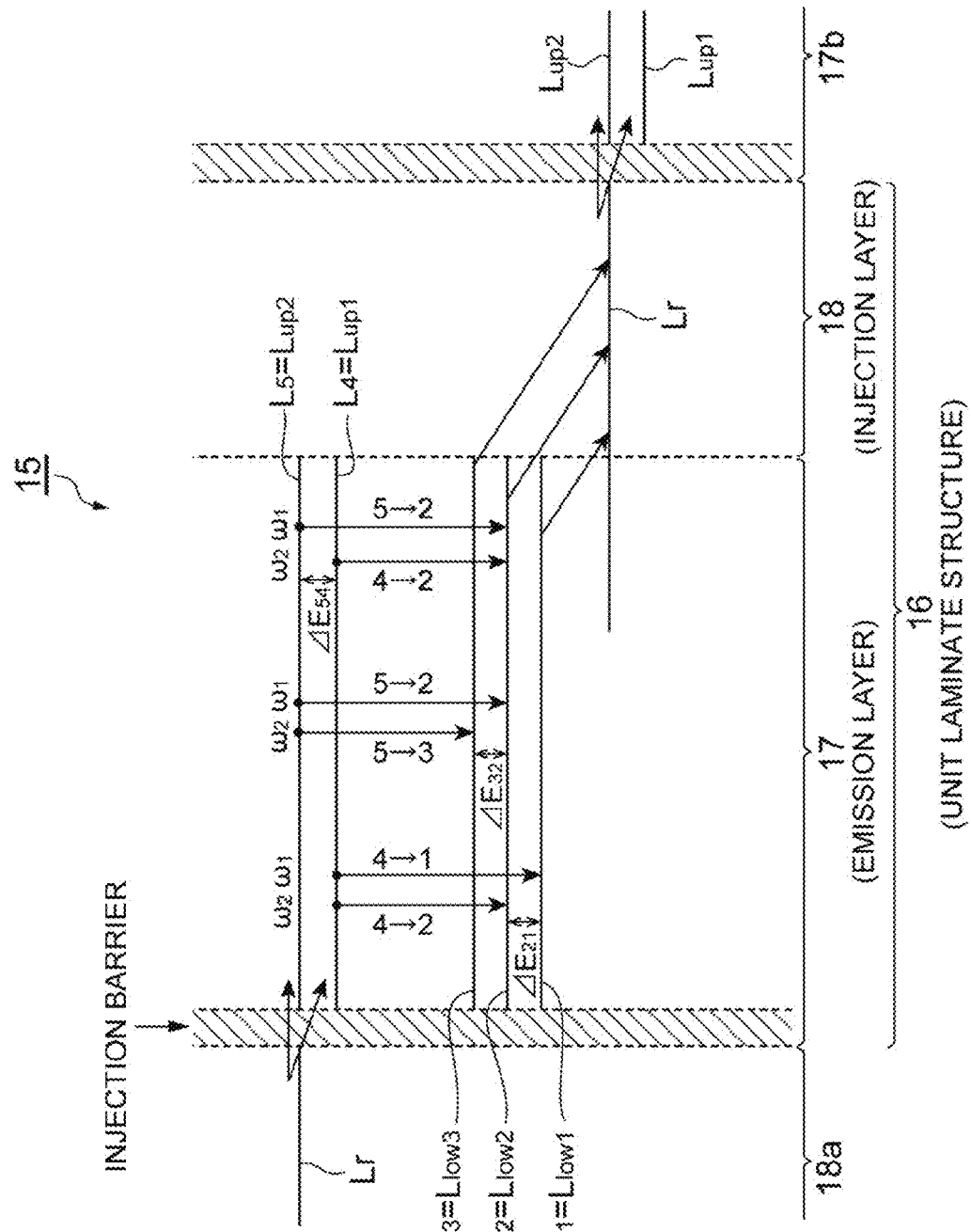
FIG. 2 is a drawing showing an example of a configuration of an active layer of the quantum cascade laser, and a subband level structure in the active layer.

FIG. 2 is a drawing showing an example of a configuration of the active layer 15 of the quantum cascade laser 1A shown in FIG. 1, and a subband level structure in the active layer 15. The active layer 15 in the present embodiment has a DAU/MS (dual-upper-state to multiple lower state) structure (cf. Patent Document 4: Japanese Patent Application Laid-Open Publication No. 2011-035139, Patent Document 5: Japanese Patent Application Laid-Open Publication No. 2011-243781, Patent Document 6: Japanese Patent Application Laid-Open Publication No. 2013-098251), and is configured to be capable of generating light of the first frequency $\omega_1$ and light of the second frequency $\omega_2$.

As shown in FIG. 2, each of the plurality of unit laminate structures 16 included in the active layer 15 is configured with a quantum well emission layer 17 and an electron injection layer 18. Each of these emission layer 17 and injection layer 18 is formed with a predetermined quantum well structure including quantum well layers and quantum barrier layers. In this configuration, the subband level structure, which is an energy level structure based on the quantum well structure, is formed in the unit laminate structure 16.

The unit laminate structure 16 in the present embodiment has a first emission upper level (level 4) $L_{up1}=L_4$, a second emission upper level (level 5) $L_{up2}=L_5$ having a higher energy than the first emission upper level, and a plurality of emission lower levels, in its subband level structure. In the configuration example shown in FIG. 2, as a level having a lower energy than the emission lower levels, a relaxation level $L_r$ is provided.

The unit laminate structure 16, more specifically in the above subband level structure, has a first emission lower level (level 1) $L_{low1}=L_1$, a second emission lower level (level 2) $L_{low2}=L_2$ having a higher energy than the first emission lower level, and a third emission lower level (level 3) $L_{low3}=L_3$ having a higher energy than the second emission lower level, as the plurality of emission lower levels each having a lower energy than the first emission upper level.

In the unit laminate structure 16 shown in FIG. 2, between the emission layer 17 and an injection layer 18a in the unit laminate structure of the preceding stage, an injection barrier layer for electrons to be injected from the injection layer 18a into the emission layer 17 is provided. An exit barrier layer for electrons from the emission layer 17 to the injection layer 18 is provided as needed between the emission layer 17 and the injection layer 18. However, FIG. 2 shows the configuration example in which only a barrier layer thin enough for the wave function to sufficiently exude is provided between the emission layer 17 and the injection layer 18.

A specific interval configuration of the levels in the subband level structure in the unit laminate structure 16 is as follows: each of an energy $\Delta E_{41}$ of an emission transition (4→1) from the first emission upper level $L_{up1}$ to the first emission lower level $L_{low1}$ and an energy $\Delta E_{52}$ of an emission transition (5→2) from the second emission upper level $L_{up2}$ to the second emission lower level $L_{low2}$ is substantially equal to an energy $E_1$ of the light of the first frequency $\omega_1$ ($\Delta E_{41}=\Delta E_{52}=E_1$). Furthermore, each of an energy $\Delta E_{42}$ of an emission transition (4→2) from the first emission upper level $L_{up1}$ to the second emission lower level $L_{low2}$ and an energy $\Delta E_{53}$ of an emission transition (5→3) from the second emission upper level $L_{up2}$ to the third emission lower level $L_{low3}$ is substantially equal to an energy $E_2$ of the light of the second frequency $\omega_2$ ($\Delta E_{42}=\Delta E_{53}=E_2$). In the present configuration example, the first, second frequencies $\omega_1$, $\omega_2$ are set so as to satisfy the condition $\omega_1>\omega_2$, and the difference frequency is $\omega=\omega_1-\omega_2$.

In the above subband level structure, each of an energy difference $\Delta E_{21}$ between the first emission lower level $L_{low1}$ and the second emission lower level $L_{low2}$, an energy difference $\Delta E_{32}$ between the second emission lower level $L_{low2}$ and the third emission lower level $L_{low3}$, and an energy difference $\Delta E_{54}$ between the first emission upper level $L_{up1}$ and the second emission upper level $L_{up2}$ is substantially equal to an energy $E=E_1-E_2$ of the light of the difference frequency $\omega$ between the first, second frequencies $\omega_1$, $\omega_2$ ($\Delta E_{21}=\Delta E_{32}=\Delta E_{54}=E$).

In this subband level structure, electrons from the relaxation level $L_r$ in the injection layer 18a of the preceding stage are injected through the injection barrier into the emission layer 17, to strongly excite the second emission upper level $L_{up2}$ coupled to the relaxation level $L_r$. At this time, a sufficient amount of electrons are also supplied to the first emission upper level $L_{up1}$ through a high-speed scattering process such as electron-electron scattering, with the result that sufficient amounts of carriers are supplied to both of the two emission upper levels $L_{up1}$, $L_{up2}$.

The electrons injected into the first, second emission upper levels $L_{up1}$, $L_{up2}$ transit to each of first, second, third emission lower levels $L_{low1}$, $L_{low2}$, $L_{low3}$, so as to generate and emit light with energies corresponding to the energy differences between the subband levels of the emission upper levels and the lower levels; particularly, it results in generating and emitting the first pump light of the first frequency $\omega_1$ with the energy $E_1$ and the second pump light of the second frequency $\omega_2$ with the energy $E_2$.

The electrons having transited to the emission lower levels $L_{low1}$, $L_{low2}$, $L_{low3}$ are relaxed to the relaxation level $L_r$. As the electrons are extracted from the emission lower levels $L_{low1}$, $L_{low2}$, $L_{low3}$ in this manner, population inversion is formed to achieve lasing between the upper levels $L_{up1}$, $L_{up2}$ and the lower levels $L_{low1}$, $L_{low2}$, $L_{low3}$. Here, the relaxation level $L_r$ used for relaxation of electrons is schematically represented by only one level in FIG. 2, but the relaxation level may be configured by a plurality of levels, or by a miniband. The electrons relaxed from the emission lower levels to the relaxation level $L_r$ are injected in a cascade manner from the relaxation level $L_r$ through the injection layer 18 into the emission upper levels $L_{up1}$, $L_{up2}$ in an emission layer 17b of the subsequent stage.

As the injection, emission transitions, and relaxation of electrons described above are repeated in the plurality of unit laminate structures 16 constituting the active layer 15, light generation occurs in a cascade manner in the active layer 15. Namely, the emission layer 17 and the injection layer 18 are stacked alternately in a large number of stages, whereby electrons move in a cascade manner in the laminate structures 16 while generating the first pump light of the first frequency $\omega_1$ and the second pump light of the second frequency $\omega_2$ during the intersubband emission transitions in each laminate structure 16. By the difference frequency generation by these first pump light and second pump light, the light of the difference frequency $\omega$ such as the terahertz light is generated and output.

The configuration of the active layer 15 will be further described later along with a specific example thereof. Regarding the active layer 15, various configurations may be used capable of generating the first pump light of the first frequency $\omega_1$ and the second pump light of the second frequency $\omega_2$, besides the configuration shown in FIG. 2. For example, as the active layer 15, a configuration may be used in which two types of active layers of a first active layer and a second active layer are stacked in series, the first active layer having a multistage lamination of first unit laminate structures each of which includes the emission layer and the injection layer and generating the first pump light of the first frequency $\omega_1$, the second active layer having a multistage lamination of second unit laminate structures each of which includes the emission layer and the injection layer and generating the second pump light of the second frequency $\omega_2$.

Referring again to FIG. 1. In the following description, an example will be mainly described in which each of the first pump light of the first frequency $\omega_1$ and the second pump light of the second frequency $\omega_2$ is mid-infrared light, the output light of the difference frequency $\omega$ is terahertz light, and InP is used as a semiconductor material of the semiconductor substrate 10. Here, the refractive index of the InP substrate in the terahertz band is $n_{THz}=3.6$ for the terahertz light of the frequency of 3 THz. The effective refractive index for the mid-infrared light to be used as the pump light is $n_{MIR}=3.37$. However, the configuration of the quantum cascade laser 1A of the present embodiment is not limited to this configuration.

The quantum cascade laser 1A of the present embodiment uses Cerenkov phase matching in generation and output of the light of the difference frequency $\omega$ by the difference frequency generation. The Cerenkov phase matching is a pseudo phase matching method, and the terahertz output light is emitted in a direction having a finite emission angle $\theta c$ with respect to a travelling direction A0 of the mid-infrared pump light, as shown in FIG. 1 by a solid arrow A1 toward the lower right direction and a dashed arrow A2 toward the lower left direction. In FIG. 1, a dotted line A3 shown with the radiation direction A1 shows the wave front of the terahertz light.

Cerenkov radiation is generated, when pump light components of two wavelengths whose difference frequency $\omega$ corresponds to the terahertz wave enter the nonlinear optical crystal, by induction of second-order nonlinear polarization having spatial distribution according to a phase difference between the components of the two wavelengths. The nonlinear polarization has a frequency to be a difference frequency between the pump light components of two wavelengths, and radiates the terahertz light at timing according to the phase of the nonlinear polarization at each point.

As a result, when the refractive index of the InP substrate in the terahertz band $n_{THz}=3.6$ is greater than the effective refractive index in the mid-infrared region $n_{MIR}=3.37$, due to refractive index dispersion, the terahertz light generated in the crystal propagates in the same phase in the radiation directions A1, A2 shown in FIG. 1. A Cerenkov emission angle $\theta c$ at this time is represented by the formula below.

$$\theta c = \cos^{-1}(n_{MIR}/n_{THz}) \sim 20°$$

Namely, in the DFG-THz-QCL in which the semiconductor laminate structure including the active layer 15 is grown on the InP substrate 10, the terahertz light generated by the difference frequency generation propagates downward from the active layer 15 at the emission angle of about 20°, as shown in FIG. 1.

The terahertz light generated in the active layer 15 to be emitted by Cerenkov radiation propagates the inside of the InP substrate 10 in the direction of the above-described emission angle $\theta c$, and finally reaches a second surface (rear surface) 10b that is an interface between the substrate 10 and the air outside the element and is opposite to the first surface 10a of the substrate 10. At this time, the refractive index of the air $n_{air}=1$ is significantly different from the refractive index of the InP substrate 10 for the terahertz light $n_{THz}=3.6$. For this reason, total reflection occurs on the second surface 10b, and it is difficult to extract the terahertz light as the output light to the outside of the element.

On the other hand, in the quantum cascade laser 1A shown in FIG. 1, a plurality of grooves 12, respectively formed in a direction intersecting with the resonating direction A0 in the laser cavity structure, are provided on the second surface 10b of the semiconductor substrate 10. In this configuration, the terahertz output light is output to the outside from each of the plurality of grooves 12, as schematically shown by an arrow A5 in FIG. 1.

Effects of the quantum cascade laser 1A of the present embodiment will be described.

In the quantum cascade laser 1A shown in FIG. 1, the active layer 15 is configured to be capable of generating the light components of two frequencies of the first pump light of the first frequency $\omega_1$ and the second pump light of the second frequency $\omega_2$, as the configuration example of the active layer 15 shown in FIG. 2. In this configuration, by using the difference frequency generation by the first pump light and the second pump light, long-wavelength output light such as the terahertz light can be generated as light of the difference frequency $\omega$.

In the quantum cascade laser 1A of the above configuration, the plurality of grooves 12 are formed extending in the direction intersecting with the resonating direction A0 of the light in the laser element, on the second surface 10b being the rear surface of the semiconductor substrate 10, for the output light to be generated by the difference frequency generation in the active layer 15. According to this configuration, the light can be suitably output such as the terahertz light generated by the difference frequency generation in the active layer 15, by making each of side surfaces of the plurality of grooves 12 provided on the substrate rear surface 10b function as an output surface for the output light.

Here, in the above configuration, regarding the formation direction of the grooves 12 on the second surface 10b of the semiconductor substrate 10, the grooves 12 are preferably respectively formed in a direction perpendicular to the resonating direction A0 on the second surface 10b. In this configuration, each of the side surfaces of the plurality of grooves 12 can be made to suitably function as the output surface for the output light such as the terahertz light.

As for the specific configuration of the plurality of grooves 12, each of the plurality of grooves 12 is preferably formed such that an inclination angle $\theta g$ of the side surface with respect to a direction perpendicular to the second surface 10b (semiconductor lamination direction in laser element) is 4° or more and 20° or less.

The semiconductor substrate 10 preferably has a thickness t of 50 µm or more and 200 µm or less.

Each of the plurality of grooves 12 is preferably formed such that a depth h is $\lambda/10$ or more and $2\lambda$, or less (1/10 or more and 2 times or less of wavelength $\lambda$ of output light), where $\lambda$ is a wavelength of the output light such as the terahertz light.

The plurality of grooves 12 is preferably formed such that an interval L of the grooves is h/2 or more and $2h/\tan\theta c+w$ or less, as shown in FIG. 1, where h is a depth of the groove, w is a width of the groove, and $\theta c$ is a Cerenkov emission angle of the output light by the difference frequency generation.

According to these configurations, the output light such as the terahertz light can be suitably output with sufficient intensity from each of side surfaces of the grooves 12 formed on the second surface 10b of the semiconductor substrate 10. Configuration conditions of the semiconductor substrate 10, the plurality of grooves 12, and the like will be specifically described later.

Figure 3:
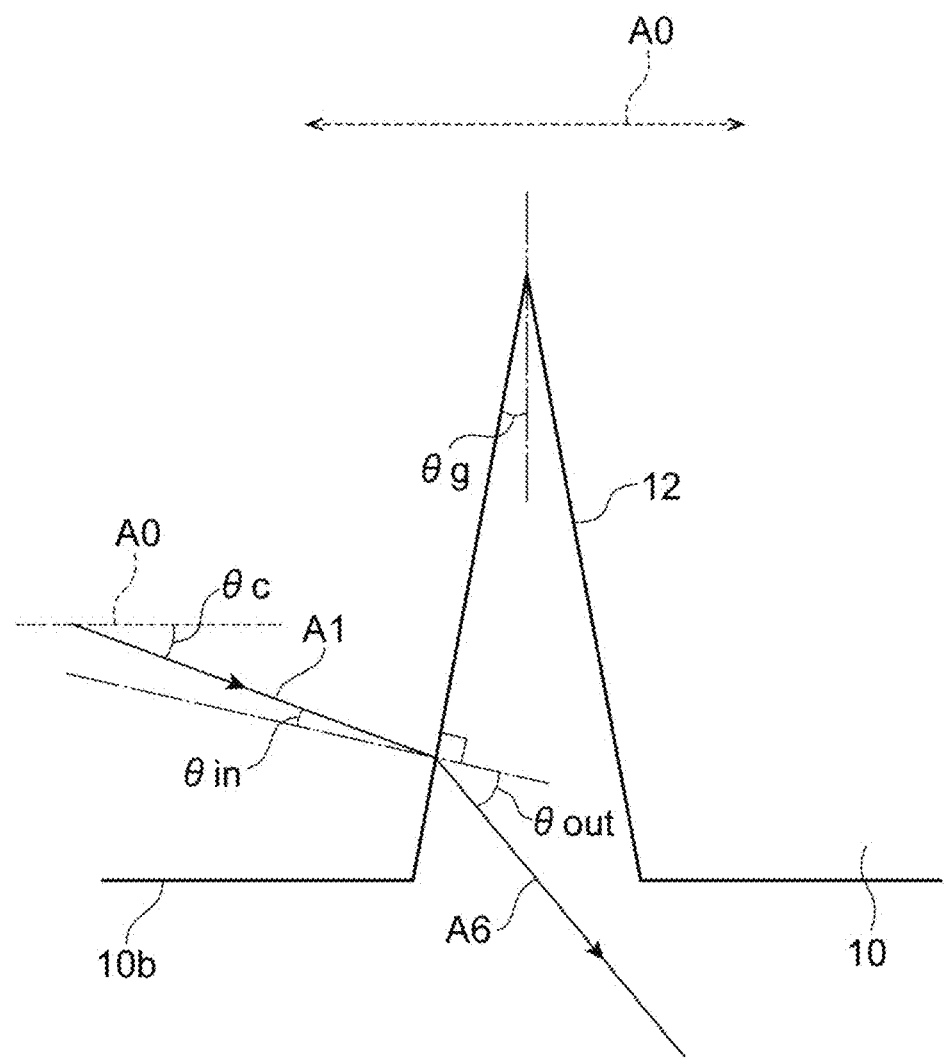
FIG. 3 is a side view showing a configuration of a groove formed on a second surface of a semiconductor substrate.
Figure 4:
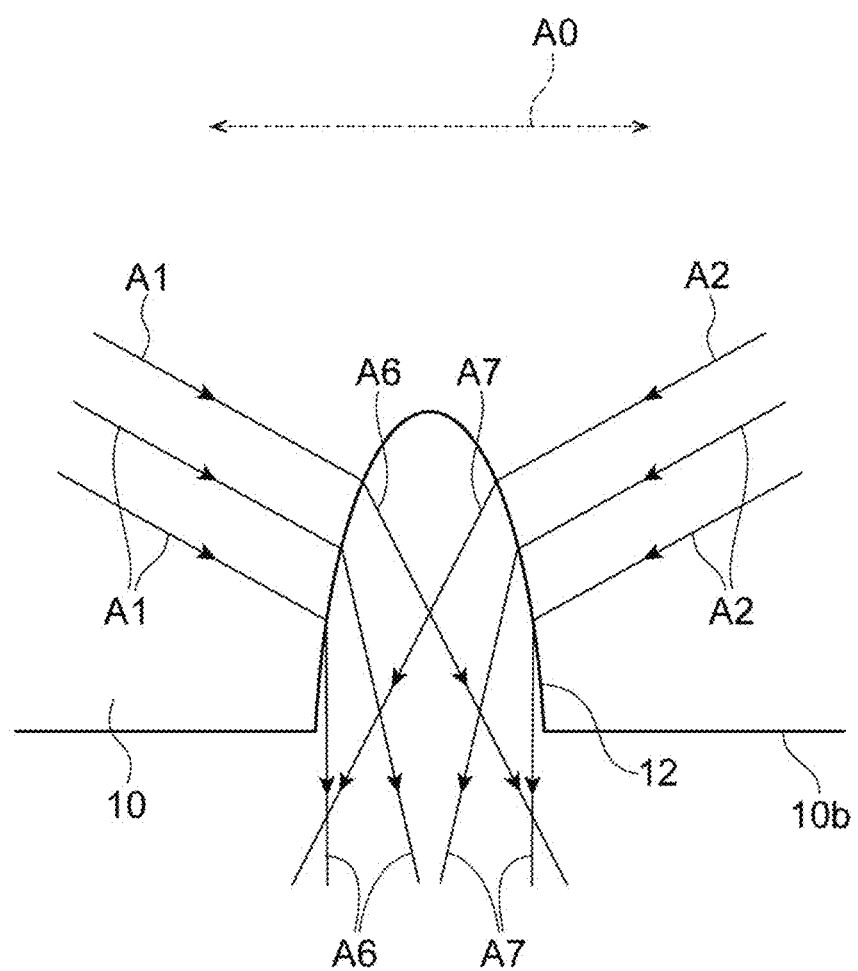
FIG. 4 is a side view showing a configuration of the groove formed on the second surface of the semiconductor substrate.
Figure 5:
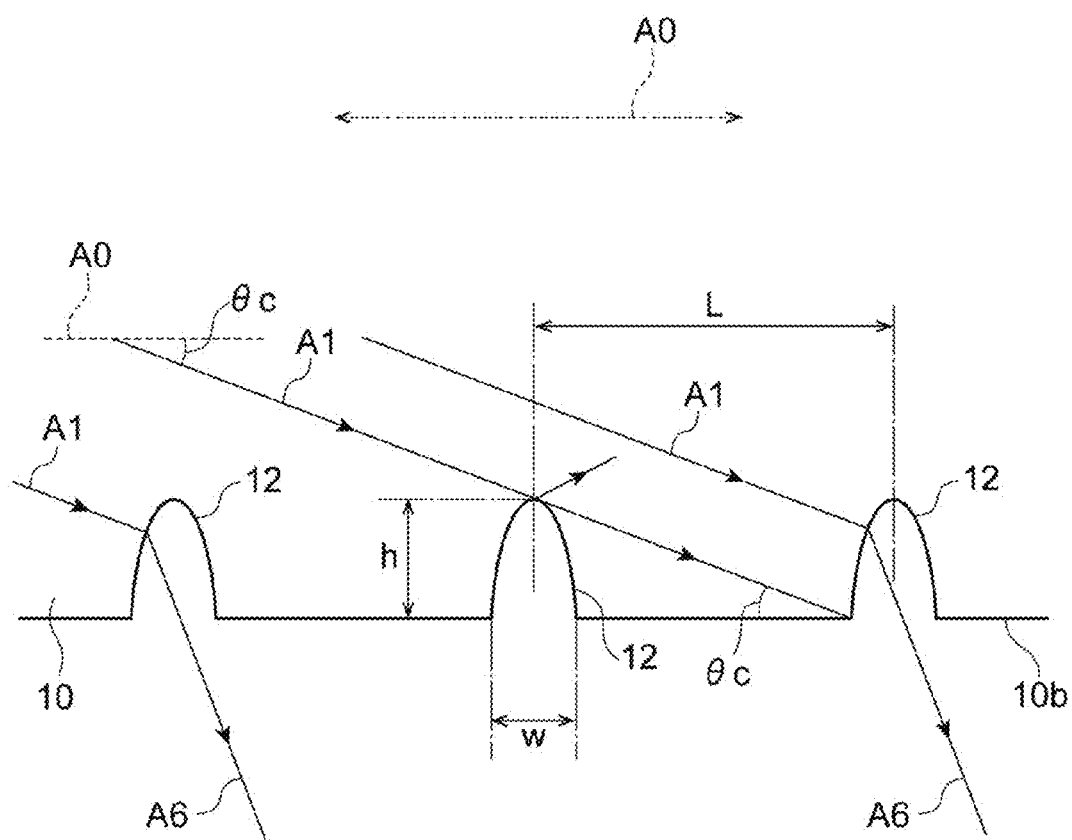
FIG. 5 is a side view showing a configuration of the grooves formed on the second surface of the semiconductor substrate.

Extraction of the terahertz output light in the plurality of grooves 12 in the quantum cascade laser 1A shown in FIG. 1 will be further described. FIG. 3 to FIG. 5 are side views showing configurations of the grooves 12 formed on the second surface 10b of the semiconductor substrate 10.

In the quantum cascade laser 1A of the above embodiment, the plurality of grooves 12 are formed on the second surface 10b of the substrate 10 as shown in FIG. 3. The terahertz light emitted by Cerenkov radiation in the radiation direction A1 at the emission angle $\theta c$ is refracted in the interface between the semiconductor and the air on the side surface of the groove 12, to be extracted to the outside as the output light in an output direction A6.

Here, as described above, a case is considered as an example in which the semiconductor substrate 10 is a semi-insulating InP substrate, the emission angle of the terahertz light from the active layer 15 to the downward direction is $\theta c=20°$, and the inclination angle of the side surface of the groove 12 with respect to the direction perpendicular to the second surface 10b is $\theta g=10°$. In this configuration, the terahertz light propagating inside the substrate 10 enters at an incident angle $\theta_{in}=10°$ to the side surface of the groove 12.

At this time, the refractive index of the air is $n_{air}=1$ in contrast with the refractive index of the InP substrate 10 in the terahertz band $n_{THz}=3.6$, and based on the Snell's law $$n_1 \sin\theta_1 = n_2 \sin\theta_2$$

the terahertz light is output refracted at an exit angle $\theta_{out}=40°$ from the side surface of the groove 12 to the downward direction. In this configuration, as a result, the terahertz light can be output in a surface direction of the semiconductor substrate 10 through the plurality of grooves 12.

Here, when the inclination angle of the side surface of the groove 12 is $\theta g=0°$ and the groove side surface is parallel to a cleaved end face, the terahertz light is totally reflected and is not output to the outside. When the terahertz light propagates inside the substrate 10 at the emission angle $\theta c=20°$, the terahertz light is output in the surface direction of the substrate 10 without being totally reflected, at the inclination angle $\theta g$ of the groove side surface of 4° or more. On the other hand, when the inclination angle $\theta g$ of the groove side surface is greater than 20°, the terahertz light is refracted upward, so that components to be taken in again to the substrate 10 are generated. Therefore, regarding the side surface of the groove 12, the groove 12 is preferably formed such that its inclination angle $\theta g$ is 4° or more and 20° or less.

The groove 12 actually faulted on the second surface 10b of the semiconductor substrate 10 does not have a pointed shape with the planar side surface as shown in FIG. 3, but has the side surface of a curved shape and has the shape whose inclination angle continuously varies inside the groove as shown in FIG. 4. In this case, as shown in FIG. 4 by propagating directions A1, A2 inside the substrate 10 of the terahertz light and output directions A6, A7 from the groove side surface by solid arrows, the refraction angle of the terahertz light and the exit angle to the outside vary, depending on positions on the groove side surface.

In consideration of this point, regarding the inclination angle $\theta g$ of the side surface of the groove 12, the groove 12 is preferably formed such that the inclination angle $\theta g$ satisfies the condition of 4° or more and 20° or less in as many portions as possible of the groove side surface, for example, the surface portions of ⅓ or more of the groove side surface.

Next, the thickness of the semiconductor substrate 10 constituting the quantum cascade laser 1A will be described. The absorption coefficient in the semi-insulating InP substrate for the terahertz light of the frequency of 3 THz is about 20 cm$^{-1}$ as described above. Inside a waveguide structure including the active layer 15 in the quantum cascade laser 1A, the terahertz light has already undergone absorption of about 20 cm$^{-1}$ due to impurity doping and the like. Considering attenuation of the terahertz light due to the absorption, the thickness t of the semiconductor substrate 10 is preferably made to be as thin as possible by polishing or the like.

However, making the substrate 10 thin leads to decrease in physical strength of the laser element, so that there is a certain limit. Ideally, it is preferable that the thickness t of the substrate 10 is thinned to about 50 μm by polishing or the like so that the second surface 10b of the substrate 10 is close to the semiconductor laminate structure on the substrate 10 functioning as a waveguide structure, and the groove 12 of the depth h (cf. FIG. 1) of close to 50 μm is formed on the second surface 10b of the substrate 10. This enables the upper end of the groove 12 to be close to the waveguide structure formed on the first surface 10a of the substrate 10.

The thickness t of the semiconductor substrate 10 is, for example, in the example described later, set to 150 μm. When the thickness of the semiconductor substrate 10 is greater than 200 μm, the terahertz light is considered to be attenuated to the intensity of half or less. For this reason, the thickness t of the substrate 10 is preferably at least 200 μm or less. Therefore, the thickness t of the semiconductor substrate 10 is preferably 50 μm or more and 200 μm or less.

Next, the depth h of the groove 12 formed on the second surface 10b of the semiconductor substrate 10 will be described. When the depth h of the groove 12 is too large, the terahertz light emitted from the groove side surface in the deep portion of the groove 12 may be taken in to the inside of the substrate 10 again inside the groove 12. On the other hand, when the depth h of the groove 12 is too small, an area is small in which the terahertz light propagating inside the substrate 10 reaches the groove side surface.

In consideration of this point, the appropriate depth h of the groove 12 varies depending on the wavelength λ (frequency ω) of the terahertz light, and is considered to be appropriate at about two times of the wavelength λ when it is the largest, and at about ⅒ of the wavelength when it is the smallest. Therefore, the depth h of each of the plurality of grooves 12 is preferably λ/10 or more and 2λ or less, for the wavelength λ of the terahertz output light. For example, in a case of the terahertz light of the frequency of 3 THz, the wavelength λ is about 100 μm, and the range of the appropriate depth h of the groove 12 is from 10 μm to 200 μm.

Next, the interval L between the grooves adjacent to each other in the plurality of grooves 12 formed on the second surface 10b of the semiconductor substrate 10 will be described with reference to FIG. 5. The interval L of the grooves 12 is associated with the depth h. Namely, when the interval L of the groove 12 is narrow, and the groove 12 is deep, the terahertz light propagating inside the substrate 10 hits the deep portion of the groove 12 first, so that the terahertz light cannot reach the shallow portion of the groove 12. Therefore, a surface portion not contributing output of the terahertz light is generated in the side surface of the groove 12.

The interval Lc of the grooves for using all portions of the side surface of the groove 12 for light output is given by the formula below.

$$Lc = h/\tan \theta c + w/2$$

Here, h is a depth of the groove, w is a width of the groove, and θc is a Cerenkov emission angle of the output light by the above-described difference frequency generation. In this condition, the terahertz light propagating inside the substrate 10 is refracted at the interface between the semiconductor and the air at the side surface of the groove 12. However, the situation varies of the propagating wave front in the air of the terahertz light output from the groove side surface, also depending on the inclination angle θg of the groove side surface. Therefore, in setting of the interval L of the grooves 12, such wave front conditions should also be considered.

When the interval L of the groove 12 is significantly wider than the above-described interval Lc, a lot of the terahertz light propagating inside the substrate 10 reaches the second surface 10b of the substrate 10 rather than the side surface of the groove 12. For this reason, the interval L of the groove 12 is preferably two times of the above interval Lc or less. For example, the interval L of the grooves 12 is set to 200 μm, in the example described later.

On the other hand, when the interval L of the groove 12 is narrow, only the deep portion of the side surface of the groove 12 contributes the light output, as described above. Considering this point, the interval L of the grooves 12 is preferably half of the depth h of the groove 12 or more. Therefore, the interval L of the grooves 12 is preferably h/2 or more and 2h/tan θc+w or less. In the example described later, the range of the appropriate interval L of the grooves 12 is from 17 μm to 206 μm.

Figure 6:
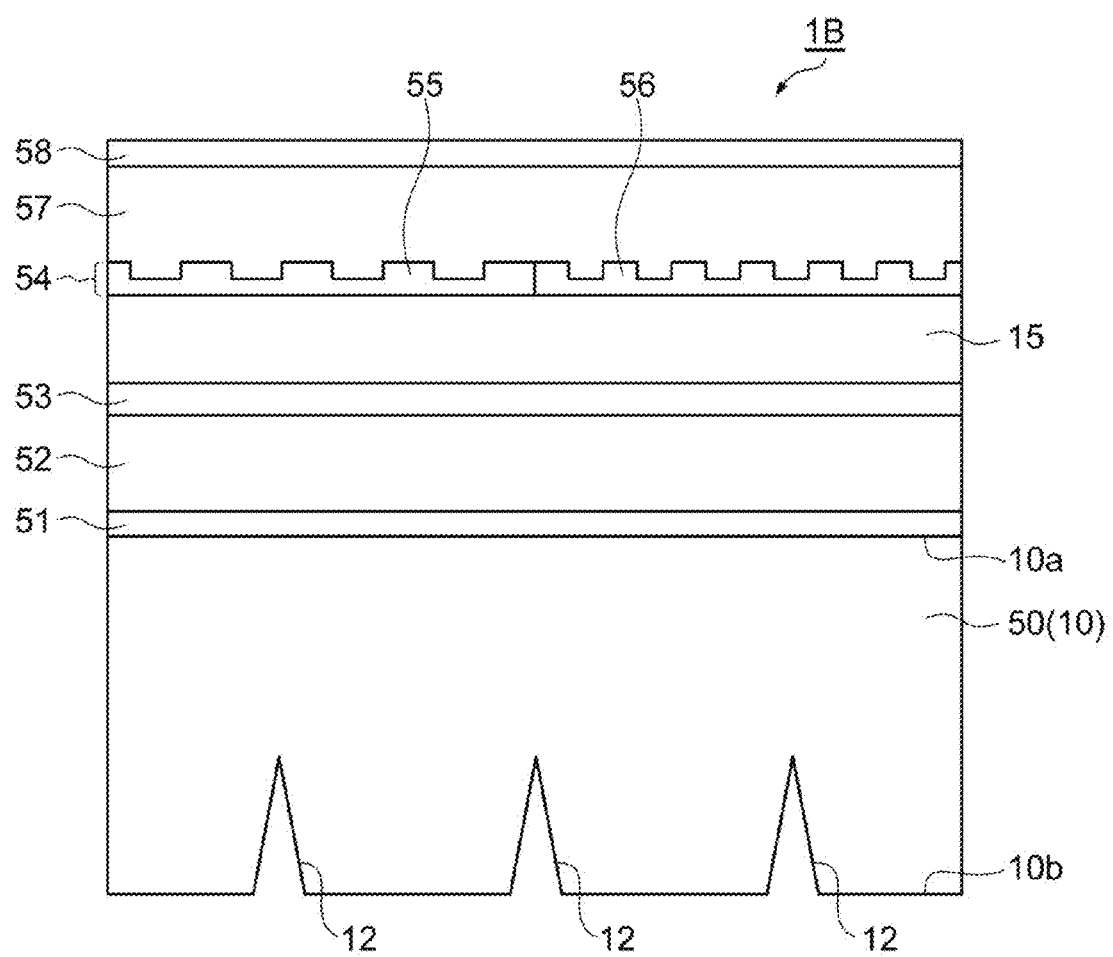
FIG. 6 is a side cross-sectional view showing an example of a specific configuration of the quantum cascade laser.
Figure 7:
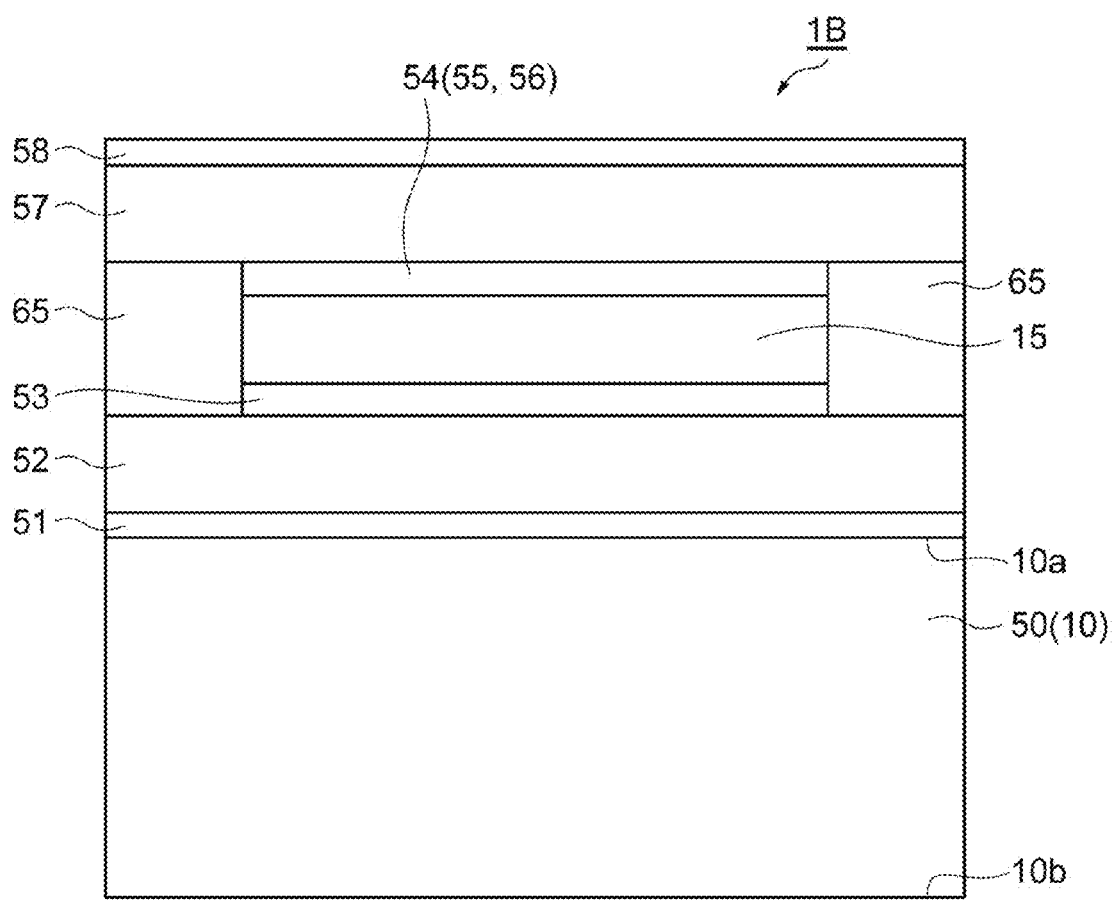
FIG. 7 is a front view showing the example of the specific configuration of the quantum cascade laser.
Figure 8:
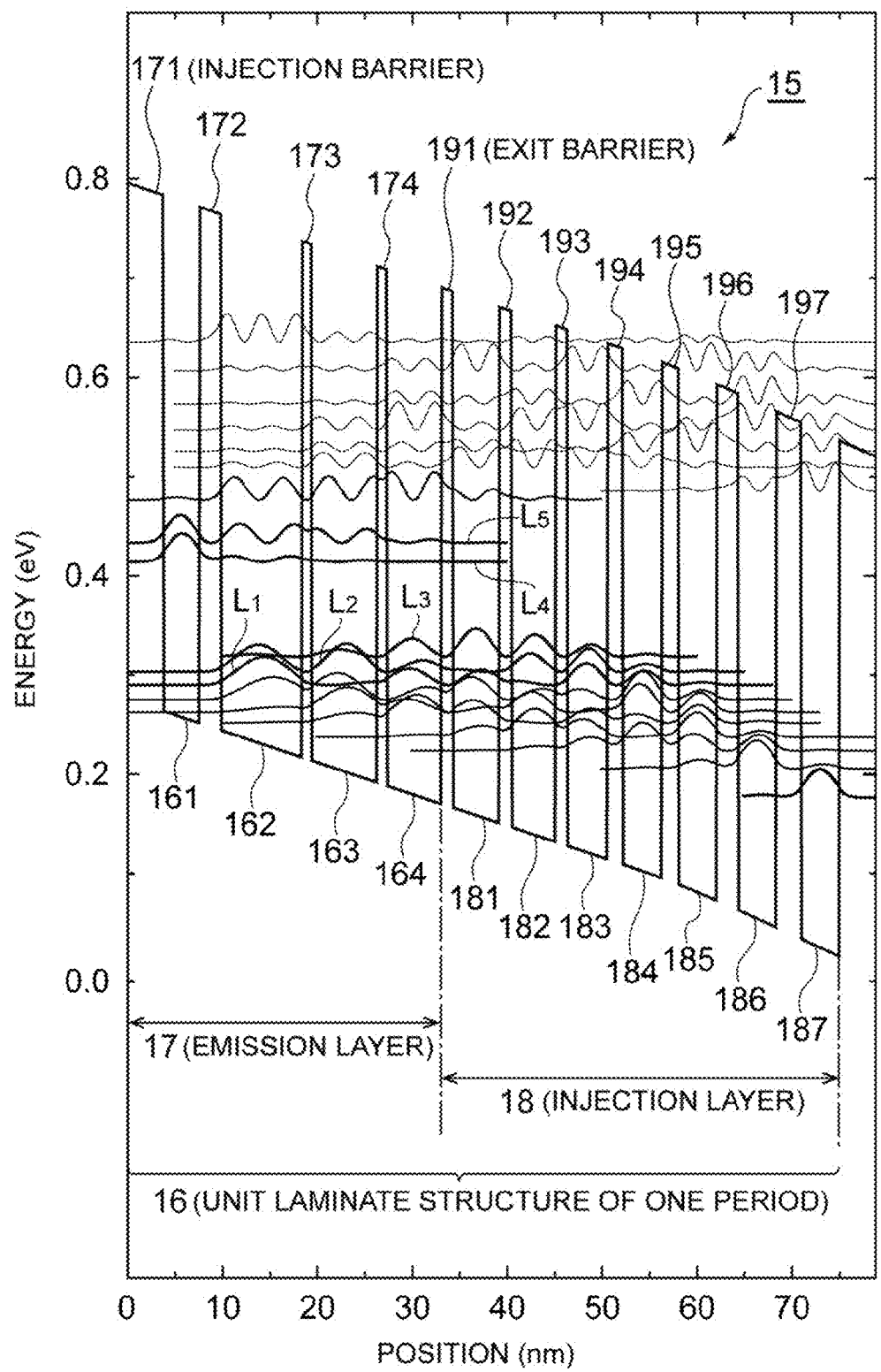
FIG. 8 is a drawing showing an example of a configuration of a unit laminate structure constituting the active layer.

The configuration of the quantum cascade laser will be farther described along with a specific example of the element structure including the quantum well structure in the active layer. FIG. 6 is a side cross-sectional view showing a cross section along the resonating direction of an example of a specific configuration of the quantum cascade laser. FIG. 7 is a front view showing the configuration of the quantum cascade laser shown in FIG. 6 as viewed from the end face direction. FIG. 8 is a drawing showing an example of a configuration of the unit laminate structure constituting the active layer in the quantum cascade laser shown in FIG. 6. FIG. 9 is a table showing an example of a structure of the unit laminate structure of one period in the active layer.

Here, FIG. 8 shows, for a part of the multistage repetition structure based on the emission layer 17 and the injection layer 18 in the active layer 15, the quantum well structure and the subband level structure in the operating field. The subband level structure illustrated in FIG. 8 is a specific example of the level structure shown in FIG. 2. The element structure shown in FIG. 6 to FIG. 9 can be formed by crystal growth, e.g., by the molecular beam epitaxy (MBE) method or by the metal organic chemical vapor deposition (MOCVD) method.

In the semiconductor laminate structure of a quantum cascade laser 1B shown in FIG. 6, FIG. 7, considering absorption of the terahertz light, a semi-insulating InP substrate 50 of thickness t=150 μm is used as the semiconductor substrate 10. On the InP substrate 50, the element structure of the quantum cascade laser 1B is formed by sequentially stacking, in order from the substrate side, a high concentration Si-doped (Si: 1.5×10$^{18}$ cm$^{-3}$) InGaAs lower contact layer 51 of the thickness of 400 nm, a Si-doped (Si: 1.5×10$^{16}$ cm$^{-3}$) InP lower cladding layer 52 of the thickness of 5 μm, a Si-doped (Si: 1.5×10$^{16}$ cm$^{-3}$) InGaAs lower guide layer 53 of the thickness of 250 nm, the active layer 15 in which the unit laminate structures 16 are laminated by 40 periods, a Si-doped (Si: $1.5\times10^{16}$ cm$^{-3}$) InGaAs upper guide layer 54 of the thickness of 450 nm, a Si-doped (Si: $1.5\times10^{16}$ cm$^{-3}$) InP upper cladding layer 57 of the thickness of 5 µm, and a high concentration Si-doped (Si: $1.5\times10^{18}$ cm$^{-3}$) InP upper contact layer 58 of the thickness of 15 nm.

In the upper guide layer 54, as shown in FIG. 6, a diffraction grating structure of the depth of 250 nm functioning as a wavelength selection mechanism (frequency selection mechanism) is formed by etching. Specifically, the upper guide layer 54 is divided into two regions along the resonating direction of light, and one of the regions includes a first diffraction grating structure 55 for generating the first pump light of the frequency $\omega_1$, and the other includes a second diffraction grating structure 56 for generating the second pump light of the frequency $\omega_2$.

The active layer 15 and the guide layers 53, 54, constituting the core layer portion in the waveguide structure including the cladding layers 52, 57, are formed, for example, in the form of the ridge stripe of width of 12 µm along the resonating direction of the light, after forming the diffraction grating structures in the guide layer 54, as shown in FIG. 7. Fe-doped InP support layers 65 are formed by embedding regrowth with the MOCVD or the like, to cover both side walls of the ridge stripe. On the second surface 10b of the InP substrate 50, the plurality of grooves 12 are formed for outputting the terahertz light of the difference frequency $\omega$ generated by the difference frequency generation. Formation of an insulating film, formation of an electrode, and the like are further performed for this element structure, as needed.

As described above, the active layer 15 in the present configuration example is configured such that the unit laminate structures 16 each including the quantum well emission layer 17 and the electron injection layer 18 are laminated by 40 periods. In the present configuration example, the center wavelength of the gain in the active layer 15 is set to 10 µm. The unit laminate structure 16 of one period is configured as the quantum well structure in which eleven quantum well layers 161-164, 181-187, and eleven quantum barrier layers 171-174, 191-197 are alternately stacked, as shown in FIG. 8, FIG. 9.

In the respective semiconductor layers of the unit laminate structure 16, each of the quantum well layers is configured with an InGaAs layer lattice-matched with the InP substrate 50. Each of the quantum barrier layers is configured with an InAlAs layer lattice-matched with the InP substrate 50. In this configuration, the active layer 15 is configured by an InGaAs/InAlAs quantum well structure.

In the unit laminate structure 16, concerning the emission layer 17 and the injection layer 18, the laminate part consisting of four well layers 161-164 and barrier layers 171-174 in the laminate structure shown in FIG. 8 serves as a portion to function mainly as the emission layer 17. Furthermore, the laminate part consisting of seven well layers 181-187 and barrier layers 191-197 serves as a portion to function mainly as the injection layer 18. The quantum barrier layer 171 of the first stage, in the semiconductor layers of the emission layer 17, is an injection barrier layer.

In the present configuration example, regarding the exit barrier layer positioned between the emission layer 17 and the injection layer 18, there is no barrier layer effectively functioning as an exit barrier. In FIG. 8, the barrier layer 191 is formally defined as the exit barrier layer, and in its front and rear, the emission layer 17 and the injection layer 18 are functionally divided. In FIG. 9, a specific example is shown of a structure of the unit laminate structure 16 of one period in the active layer 15.

In the quantum cascade laser 1B, to achieve terahertz light generation by the difference frequency generation, an active layer is required capable of generating two wavelengths of pump light components and having a high second-order nonlinear susceptibility $\chi^{(2)}$ for the pump light. In the active layer 15 of the present configuration example, generation of the first pump light of the frequency $\omega_1$ and the second pump light of the frequency $\omega_2$ in a single active layer design, and generation of the terahertz light of the difference frequency $\omega$ by the difference frequency generation are achieved, by adopting the DAU/MS structure shown in FIG. 2 to use a wide gain bandwidth of a coupled dual upper level structure, and by providing two types of diffraction grating structures 55, 56 in the guide layer 54 for the active layer 15.

The subband level structure shown in FIG. 8 is designed such that electrons perform optical transitions from strongly coupled two upper levels $L_4$, $L_5$ to the plurality of lower levels $L_1$, $L_2$, $L_3$. In the configuration example shown in FIG. 8, the energy interval between the two upper levels $L_4$, $L_5$ is $\Delta E_{54}$ 18 meV. The energy intervals between other levels are $\Delta E_{53}$=121 meV, $\Delta E_{52}$=136 meV, $\Delta E_{51}$=149 meV, $\Delta E_{43}$ 102 meV, $\Delta E_{42}$=117 meV, and $\Delta E_{41}$=131 meV.

In this configuration, electrons injected from the injection layer of the preceding stage into the emission layer 17 are equally distributed to the upper levels $L_4$, $L_5$ by high-speed electron-electron scattering or the like, and the two upper levels $L_4$, $L_5$ behave as if they were extended single upper level. Therefore, the gain by transitions from the upper level $L_4$ to the lower levels $L_1$ to $L_3$ and the gain by transitions from the upper level $L_5$ to the lower levels $L_1$ to $L_3$ overlap with each other in equivalent contribution, and a unimodal wide band emission spectrum is obtained.

In this configuration in which a single active layer structure is used, different from the configuration in which the plurality of active layer structures are stacked, a uniform nonlinear optical characteristic is obtained over the entire region of the active layer, thereby enabling achieving high efficiency wavelength conversion. When defining assumed carrier concentrations in the levels $L_1$ to $L_5$ as $n_1$ to $n_5$ respectively and assuming $n_1$=$n_2$=$n_3$, and using conditions $n_5$-$n_i$=$1.0\times10^{15}$ cm$^{-3}$, $n_4$-$n_i$=$1.3\times10^{15}$ cm$^{-3}$ (i=1, 2, 3), as an absolute value of the total of the second-order nonlinear susceptibility $\chi^{(2)}$ generated by the DAU structure, $|\chi^{(2)}|$=23.3 nm/V is obtained.

Design frequencies $\omega_1$, $\omega_2$ of the pump light and design frequency $\omega_{THz}$=$\omega_1$-$\omega_2$ of the terahertz output light are determined by the first, second diffraction grating structures 55, 56 in the upper guide layer 54. Here, since emission is obtained in a frequency range from 1.5 THz to 5 THz in the DFG-THz-QCL in general, the active layer 15 is designed such that the frequency $\omega_{THz}$ of the terahertz output light is within this range. In the present configuration example, the frequency of the terahertz output light is set to 3 THz. In the present configuration example, the first pump light of the frequency $\omega_1$ and the second pump light of the frequency $\omega_2$ are both made to operate in a single mode by using a DFB (distributed feedback) structure of two periods by the first, second diffraction grating structures 55, 56 in the upper guide layer 54, and by this configuration, the terahertz output light is made to operate in the single mode.

Figure 10B:
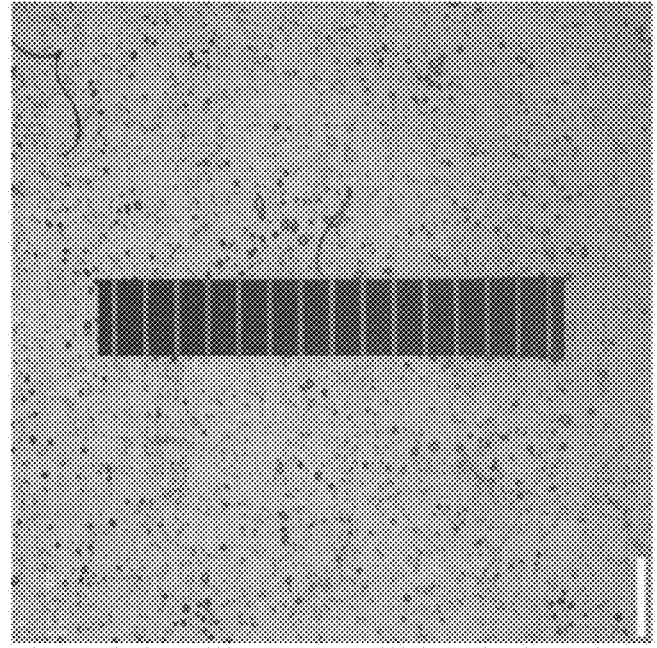
FIG. 10A and FIG. 10B are photographs showing a fabrication example of the quantum cascade laser.
Figure 10A:
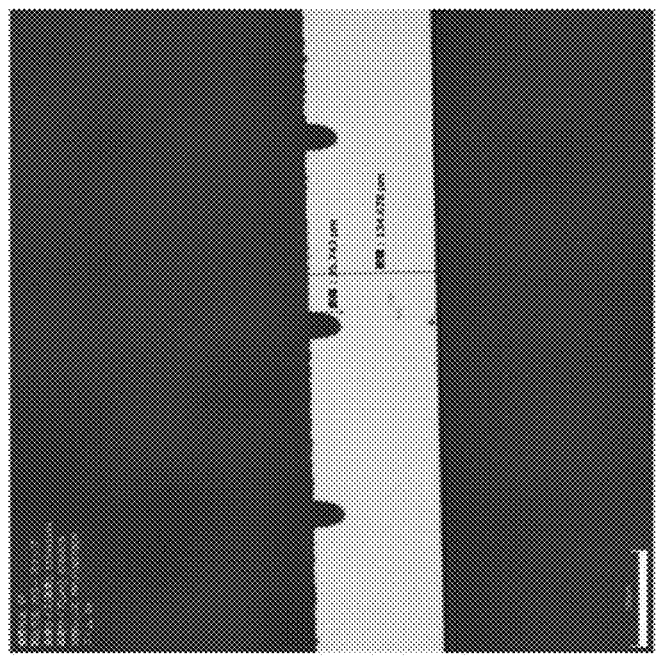

In the quantum cascade laser 1B shown in FIG. 6 to FIG. 9, after completion of formation process of the element structure on the first surface 10a, substrate polishing is performed to decrease influence of absorption of light inside the InP substrate 50 to thin the thickness t of the substrate 50 to about 135 μm. FIG. 10A and FIG. 10B are photographs showing a fabrication example of the quantum cascade laser; FIG. 10A shows a cross section configuration as viewed from the side surface side of the laser element, and FIG. 10B shows a configuration as viewed from the bottom surface side of the laser element.

In the fabrication example shown in FIG. 10A and FIG. 10B, the grooves 12 are formed of the depth h=35 μm, width w=28 μm, at intervals of about 200 μm along the laser cavity of the cavity length of about 3 mm, by using a dicing saw for the second surface (rear surface) 10b of the InP substrate 50. After formation of the groove structure, wet etching is performed to give an angle of about 10° from the vertical, to the inclination angle of the side surface of the groove 12 with respect to the substrate 50, thereby preventing total reflection to the inside of the substrate 50 to improve output efficiency of the terahertz light to the outside.

Figure 11:
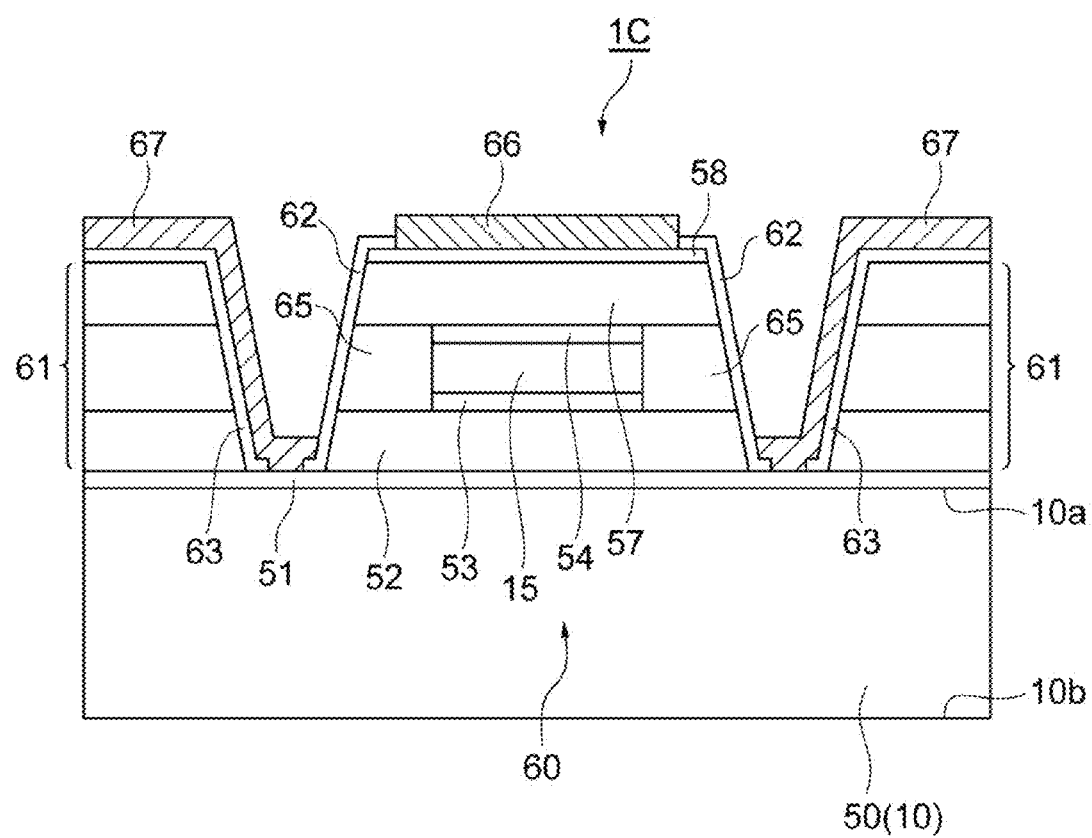
FIG. 11 is a front view showing an example of an element structure of the quantum cascade laser.

The specific configuration of the quantum cascade laser will be further described. FIG. 11 is a front view showing an example of an element structure of the quantum cascade laser. In a quantum cascade laser 1C of the present configuration example, etching is performed for exposing the lower contact layer 51 of the InP substrate 50 side for the element structure shown in FIG. 6, FIG. 7, to form an element structure portion 60 including the active layer 15 and the like, and support structure portions 61 of both sides thereof.

A SiN insulating layer 62 is provided to cover the element structure portion 60, and an upper electrode 66 is formed electrically connected to the upper contact layer 58 through a contact hole of the insulating layer 62. A SiN insulating layer 63 is provided to cover the support structure portion 61, and a lower electrode 67 is formed electrically connected to the lower contact layer 54 through the contact hole between the insulating layers 62, 63. These electrodes 66, 67 can be formed by, for example, forming a thick Au film of the thickness of about 5 μm by evaporation and plating method and then separating the upper and lower electrodes from each other by etching.

In this formation of the element structure, regarding the etching method, any methods may be used of the wet etching and the dry etching. Also regarding fine patterning, any methods may be used, as far as they are capable of processing of the desired size, such as the interference exposure method, and the nanoimprint method.

Figure 12:
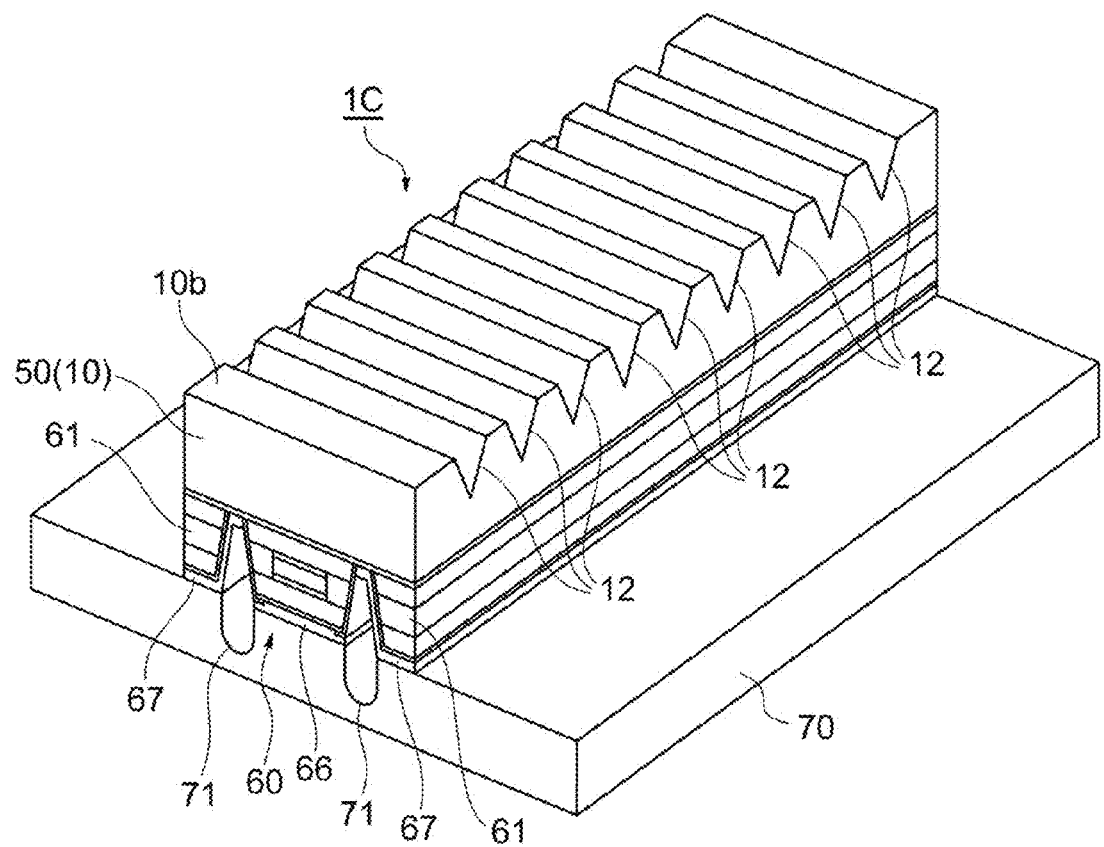
FIG. 12 is a perspective view showing another example of the element structure of the quantum cascade laser.

FIG. 12 is a perspective view showing another example of the element structure of the quantum cascade laser. In the quantum cascade laser 1C of the configuration shown in FIG. 11, the terahertz light generated by the difference frequency generation is emitted to the substrate 50 side at the emission angle θc with respect to the resonating direction of the pump light as shown in FIG. 1. Considering this point, so-called epi-down assembly is preferably used, in which the assembly is performed so that the rear surface 10b on which the grooves 12 are formed in the substrate 50 of the quantum cascade laser 1C is the upper side, as shown in FIG. 12.

In the configuration example shown in FIG. 12, an assembly example of the laser element is shown, in which a sub-mount 70 is used in which the bonding pad is divided by grooves 71 so that the upper electrode 66 and the lower electrode 67 are not connected to each other, and the quantum cascade laser 1C is arranged on the sub-mount 70. This configuration facilitates wire bonding, and facilitates arrangement of the optical system.

Figure 13:
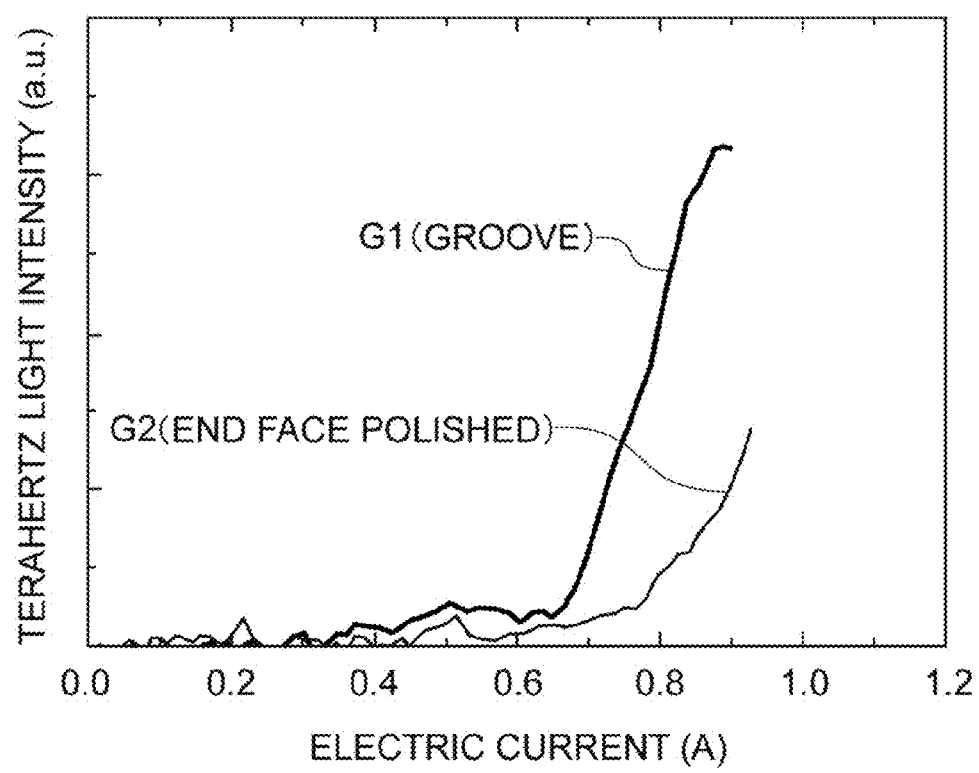
FIG. 13 is a graph showing electric current dependence of intensity of the terahertz light output from the quantum cascade laser.

FIG. 13 is a graph showing electric current dependence of intensity of the terahertz light output from the quantum cascade laser. In the graph, the horizontal axis represents the electric current (A), and the vertical axis represents the intensity of the terahertz light (a.u.). In FIG. 13, a graph G1 shows electric current-light output characteristics in the quantum cascade laser of the configuration in which the plurality of grooves 12 are provided on the rear surface 10b of the substrate 10 in the above-described embodiment. A graph G2 shows electric current-light output characteristics in the quantum cascade laser of the conventional configuration in which the substrate end face is polished at an angle of 20°.

In measurement, at the room temperature and in a nitrogen purged environment condition, the terahertz output light is collected by using two parabolic mirrors, and detection is performed using a Golay cell being a terahertz detector. The laser element is driven at 100 kHz, 200 ns, and its signal is detected by a lock-in amplifier. From the graph in FIG. 13, it can be confirmed that, in the configuration in which the plurality of grooves are provided on the substrate rear surface, the signal intensity is obtained of the same level or more of that of the conventional configuration in which the substrate end face is polished. The terahertz light output in the configuration not using Cerenkov phase matching has a low intensity that cannot be measured in the same measurement system, and the terahertz light output has not been detected.

Figure 14:
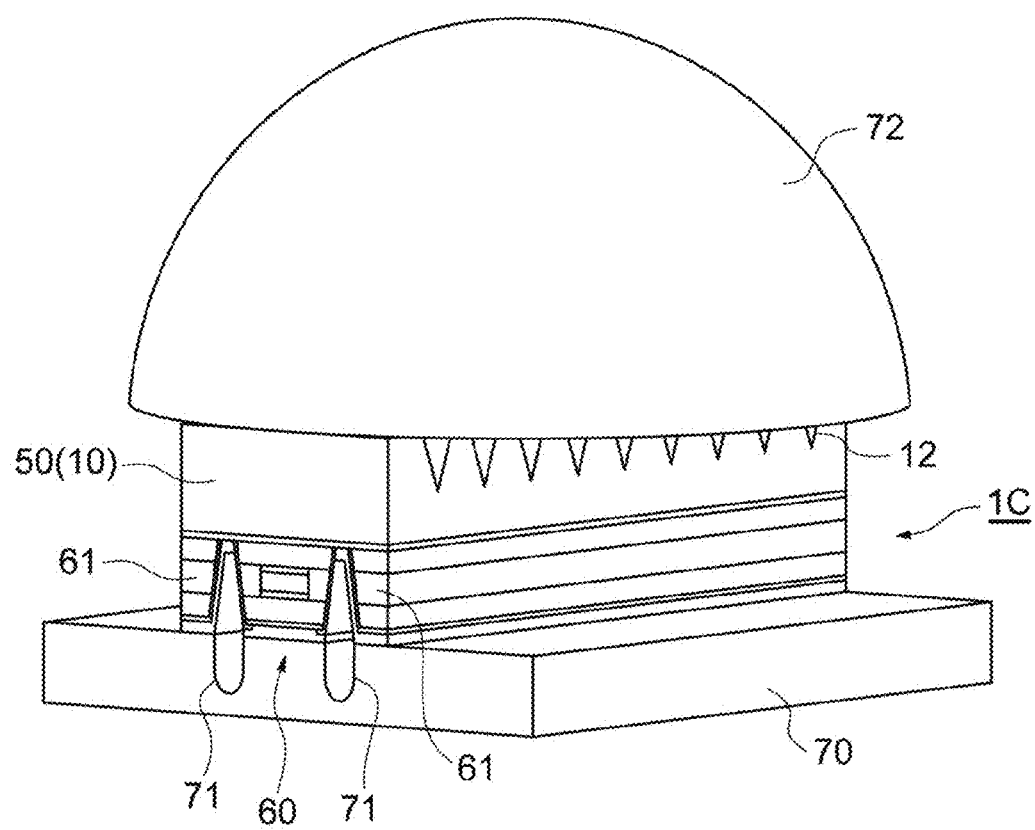
FIG. 14 is a perspective view showing yet another example of the element structure of the quantum cascade laser.

FIG. 14 is a perspective view showing yet another example of the element structure of the quantum cascade laser. In the present configuration example, in the configuration shown in FIG. 12, a lens 72 is provided on the rear surface of the substrate 10 from which the terahertz light is output, and the terahertz output light is more efficiently extracted to the outside. As the lens 72, for example, a Si hyper-hemispherical lens of the diameter of 3 mm can be used. By making the lens 72 be in close contact with the groove structure of the substrate rear surface, the terahertz output light can be efficiently collected.

Here, in the conventional configuration in which the substrate end face is polished to be the output surface of the terahertz light, the area of the output surface is small, so that it is difficult to accurately attach the lens. On the other hand, in the above configuration in which the plurality of grooves 12 are formed to make the substrate rear surface be the output surface of the terahertz light, it is possible to easily attach the lens to the substrate rear surface of millimeter size. By attaching the lens 72 to the substrate rear surface, the terahertz output light can be appropriately collimated, and at the same time, mechanical strength of the laser element can be improved.

The quantum cascade laser according to the present invention is not limited to the above-described embodiment and configuration examples, and can be variously modified. For example, in the above-described configuration example, the quantum cascade laser is configured to generate the first pump light, second pump light of the frequencies $\omega_1$, $\omega_2$ by two types of diffraction grating structures 55, 56 provided in the upper guide layer 54; however, a diffraction grating pattern may be used in which three types or more of the diffraction grating structures are mixed.

The quantum cascade laser may be configured to use difference frequency generation in a configuration in which oscillation spectrum width is extended to 1 THz or more in the Fabry-Perot operation, without using the diffraction grating structure in generation of the pump light and the terahertz light. In this configuration, although the terahertz light output is decreased compared to the configuration using the DFB, the THz spectrum of wide band can be obtained.

In the above embodiment, one type of coupled dual upper level structure is used in the active layer 15; however, it may be configured to use two or more types of active layer structures. As for the specific configuration of the active layer 15, various active layer structures may be used such as bound-to-continuum structure and two phonon resonance structure, besides the coupled dual upper level structure.

In the above-described configuration example, although the semi-insulating InP substrate is used as the semiconductor substrate 10, for example, an undoped InP substrate (Si: ~$5\times10^{15}$ cm$^{-3}$), or a low-doped InP substrate (Si: $5\times10^{15}$~$1\times10^{17}$ cm$^{-3}$) may be used as the substrate 10. When these substrates are used, a configuration becomes possible in which an electrode is provided on the substrate rear surface. However, when the doping concentration in the substrate is increased, absorption of light inside the substrate is increased, so that intensity of the terahertz light output to the outside is decreased.

In the above-described configuration example, although the active layer is shown configured to be lattice matched with the InP substrate, a configuration in which distortion compensation is introduced may be used for the active layer. In the above-described configuration example, although the example has been shown in which the InP substrate is used as the semiconductor substrate and the active layer is configured with InGaAs/InAlAs, various configurations may be used specifically, as far as they are capable of intersubband emission transitions in the quantum well structure, and capable of achieving generation of the above-described first pump light, second pump light, and generation of the output light by the difference frequency generation.

As for the semiconductor material systems, it is possible to use a variety of material systems, e.g., such as GaAs/AlGaAs, InAs/AlSb, GaN/AlGaN, and SiGe/Si, besides above-described InGaAs/InAlAs. Further, various methods may be used as crystal growth methods of semiconductors.

Regarding the laminate structure in the active layer of the quantum cascade laser and the semiconductor laminate structure as the entire laser element, various structures may be used besides the above-described structure. In general, the quantum cascade laser only needs to include the semiconductor substrate and the active layer of the above configuration provided on the first surface of the semiconductor substrate, and, on the second surface of the substrate, to be provided with the plurality of grooves each of which is formed in the direction intersecting with the resonating direction in the laser cavity structure.

The quantum cascade laser of the above embodiment includes (1) the semiconductor substrate; (2) the active layer provided on the first surface of the semiconductor substrate and having the cascade structure in which the quantum well emission layers and the injection layers are alternately stacked in the form of multistage lamination of unit laminate structures each of which includes the quantum well emission layer and the injection layer, wherein (3) the active layer is configured to be capable of generating the first pump light of the first frequency $\omega_1$ and the second pump light of the second frequency $\omega_2$ by the intersubband emission transitions of electrons, and to generate the output light of the difference frequency $\omega$ between the first frequency $\omega_1$ and the second frequency $\omega_2$ by the difference frequency generation by the first pump light and the second pump light, and (4) the grooves respectively formed in the direction intersecting with the resonating direction in the laser cavity structure are provided on the second surface opposite to the first surface of the semiconductor substrate.

Here, in the above configuration, regarding the formation direction of the plurality of grooves, the plurality of grooves are preferably respectively formed in the direction perpendicular to the resonating direction on the second surface of the semiconductor substrate. In this configuration, the side surface of each of the plurality of grooves can be made to suitably function as the output surface of the output light such as the terahertz light.

Further, as for the specific configuration of the plurality of grooves, each of the plurality of grooves is preferably formed such that the inclination angle θg of the side surface with respect to the direction perpendicular to the second surface (semiconductor lamination direction in laser element) is 4° or more and 20° or less.

Further, the semiconductor substrate preferably has the thickness t of 50 μm or more and 200 μm or less.

Further, each of the plurality of grooves is preferably formed such that the depth h is λ/10 or more and 2λ or less (¹⁄₁₀ or more and 2 times or less of wavelength λ of output light), where λ is the wavelength of the output light.

Further, the plurality of grooves are preferably formed such that the interval L of the grooves is h/2 or more and 2h/tan θc+w or less, where h is the depth of the groove, w is the width of the groove, and θc is the emission angle of the output light by the difference frequency generation.

According to these configurations, the output light such as the terahertz light can be suitably output with sufficient intensity from each of side surfaces of the plurality of grooves formed on the second surface of the semiconductor substrate.

The present invention can be used as the quantum cascade laser capable of suitably outputting the light such as the terahertz light generated by the difference frequency generation.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A quantum cascade laser comprising:
a semiconductor substrate; and
an active layer provided on a first surface of the semiconductor substrate and having a cascade structure in which quantum well emission layers and injection layers are alternately stacked in the form of a multi-stage lamination of unit laminate structures each of which comprises the quantum well emission layer and the injection layer, wherein
the active layer is configured to be capable of generating first pump light of a first frequency $\omega_1$ and second pump light of a second frequency $\omega_2$ by intersubband emission transitions of electrons, and to generate output light of a difference frequency $\omega$ between the first frequency $\omega_1$ and the second frequency $\omega_2$ by difference frequency generation from the first pump light and the second pump light,
a plurality of grooves respectively formed in a direction intersecting with a resonating direction in a laser cavity structure are provided on a second surface opposite to the first surface of the semiconductor substrate,
each of side surfaces of the plurality of grooves functions as an output surface for the output light, the output light is refracted on the interface between the semiconductor and the outside on the side surface of the groove to be extracted to the outside, the semiconductor substrate has a thickness t of 50 μm or more and 200 μm or less, each of the plurality of grooves is formed such that a depth h is $\lambda/10$ or more and $2\lambda$ or less, where $\lambda$ is a wavelength of the output light, and the plurality of grooves are formed such that an interval L of the grooves is h/tan θc +w/2 or more and 2 h/tan θc +w or less, where w is a width of the grooves, and θc is an emission angle of the output light by the difference frequency generation.

2. The quantum cascade laser according to claim 1, wherein the plurality of grooves are respectively formed in a direction perpendicular to the resonating direction on the second surface.

3. The quantum cascade laser according to claim 1, wherein each of the plurality of grooves is formed such that an inclination angle θg of a side surface with respect to a direction perpendicular to the second surface is 4° or more and 20° or less.

\* \* \* \* \*